United States Patent
Mastromatteo et al.

(10) Patent No.: US 7,595,223 B2
(45) Date of Patent: Sep. 29, 2009

(54) PROCESS FOR BONDING AND ELECTRICALLY CONNECTING MICROSYSTEMS INTEGRATED IN SEVERAL DISTINCT SUBSTRATES

(75) Inventors: Ubaldo Mastromatteo, Bareggio (IT); Mauro Bombonati, Abbiategrasso (IT); Daniela Morin, Inveruno (IT); Marta Mottura, Melegnano (IT); Mauro Marchi, Bettolle (IT)

(73) Assignees: STMicroelectronics S.r.l., Agrate Brianza (IT); Hewlett-Packard Company, Boise, ID (US)

( * ) Notice: Subject to any disclaimer, the term of this patent is extended or adjusted under 35 U.S.C. 154(b) by 0 days.

(21) Appl. No.: 11/766,654

(22) Filed: Jun. 21, 2007

(65) Prior Publication Data
US 2007/0254454 A1 Nov. 1, 2007

Related U.S. Application Data

(62) Division of application No. 10/243,972, filed on Sep. 12, 2002, now abandoned.

(30) Foreign Application Priority Data
Sep. 14, 2001 (EP) .................................. 01830590

(51) Int. Cl.
H01L 21/20 (2006.01)
H01L 21/00 (2006.01)
H01L 21/46 (2006.01)

(52) U.S. Cl. ................... 438/108; 438/455; 438/614; 257/E21.122

(58) Field of Classification Search ............ 438/108, 438/331, 455, 613, 614; 257/E21.323, E21.544
See application file for complete search history.

(56) References Cited

U.S. PATENT DOCUMENTS

| | | | |
|---|---|---|---|
| 2,378,944 A | 6/1945 | Ohl | |
| 4,021,270 A | 5/1977 | Hunt et al. | |
| 4,818,728 A | 4/1989 | Rai et al. | |
| 5,046,238 A | 9/1991 | Daigle et al. | |
| 5,130,779 A * | 7/1992 | Agarwala et al. | 257/772 |
| 5,269,453 A * | 12/1993 | Melton et al. | 228/180.22 |
| 5,302,976 A | 4/1994 | Sugahara et al. | |
| 5,329,695 A | 7/1994 | Traskos et al. | |

(Continued)

FOREIGN PATENT DOCUMENTS

DE 3233195 A1 3/1983

(Continued)

*Primary Examiner*—Walter L Lindsay, Jr.
*Assistant Examiner*—Ron E Pompey
(74) *Attorney, Agent, or Firm*—Lisa K. Jorgenson; Harold H. Bennett, II; Seed IP Law Group PLLC

(57) ABSTRACT

A process for bonding two distinct substrates that integrate microsystems, including the steps of forming micro-integrated devices in at least one of two substrates using microelectronic processing techniques and bonding the substrates. Bonding is performed by forming on a first substrate bonding regions of deformable material and pressing the substrates one against another so as to deform the bonding regions and to cause them to react chemically with the second substrate. The bonding regions are preferably formed by a thick layer of a material chosen from among aluminum, copper and nickel, covered by a thin layer of a material chosen from between palladium and platinum. Spacing regions ensure exact spacing between the two wafers.

24 Claims, 3 Drawing Sheets

U.S. PATENT DOCUMENTS

| | | | |
|---|---|---|---|
| 5,542,174 A * | 8/1996 | Chiu | 29/840 |
| 5,633,535 A | 5/1997 | Chao et al. | |
| 5,635,764 A | 6/1997 | Fujikawa et al. | |
| 5,668,033 A | 9/1997 | Ohara et al. | |
| 6,025,649 A | 2/2000 | DiGiacomo | |
| 6,036,809 A | 3/2000 | Kelly et al. | |
| 6,246,014 B1 | 6/2001 | Pommer | |
| 6,436,853 B2 | 8/2002 | Lin et al. | |
| 6,521,477 B1 | 2/2003 | Gooch et al. | |
| 6,548,898 B2 | 4/2003 | Matsuki et al. | |

FOREIGN PATENT DOCUMENTS

| | | |
|---|---|---|
| DE | 10050364 A1 | 9/2001 |
| EP | 0773436 A2 | 5/1997 |
| JP | 10107204 | 4/1998 |

* cited by examiner

PROCESS FOR BONDING AND ELECTRICALLY CONNECTING MICROSYSTEMS INTEGRATED IN SEVERAL DISTINCT SUBSTRATES

CROSS-REFERENCE TO RELATED APPLICATION

This application is a divisional of U.S. patent application Ser. No. 10/243,972, filed Sep. 12, 2002, now pending, which application is incorporated herein by reference in its entirety.

BACKGROUND OF THE INVENTION

1. Field of the Invention

The present invention relates to a process for bonding and electrically connecting microsystems integrated in several distinct substrates.

2. Description of the Related Art

As is known, numerous technological approaches allow manufacturing integrated circuits wherein the electronic circuitry coexists with a sensor element or an actuator (micro-electromechanical device). The traditional approaches envisage the production of the sensors/actuators and circuitry in a same silicon substrate (surface and epitaxial sensors). The most recent approaches envisage, instead, several substrates and the electronic circuit, the micro-electromechanical device or parts thereof are formed in distinct wafers that are subsequently bonded together and finally diced.

Bonding of the wafers is obtained by causing one or more metals to react with one another, with the silicon of one of the substrates or with metal alloys. To this aim, one or more metals are deposited in sequence on the surface of one or both of the wafers. Then the surfaces to be bonded are brought into intimate contact through a piston that applies a pre-determined pressure, as shown in FIG. 1, which illustrates a substrate 1, a first wafer 2, a layer of bonding material 3, a second wafer 4, and a piston 5 which presses the second wafer 4 against the first wafer 2.

Under the pressure of the piston 4, the bonding material reacts only where the surfaces are in a mechanical contact, and the areas that are not in contact are not bonded.

With this solution, bonding between the wafers depends to a large extent upon the mechanical force of the piston; in particular, criticalities are linked, on the one hand, to the uniformity of pressure applied by the piston and, on the other, to the possible presence of foreign bodies.

In particular, for example in the presence of non-planar areas, the pressure applied by the piston may be non-uniform over the entire surface or over the entire area where bonding is to be obtained. In this case, the presence of areas of the two wafers that are not in contact prevents bonding of these areas.

In addition, the presence of particles, acting as spacers, also entails absence of contact, which prevents bonding, as shown, by way of example, in FIG. 1, wherein a particle 7 prevents bonding in an area of the surfaces of the wafers 2, 4.

On the other hand, application of excessive pressure in an attempt to achieve uniform contact in the areas to be bonded may be counterproductive. In fact the deformation of the substrate thus induced causes stresses in the material that persist over time, weakening the bonding joints and/or subsequently causing undesired deformations, in particular in case of suspended structures. For example, a mobile part (such as a rotor of a micro-actuator), once it is released, tends to relieve the accumulated stresses. In this case, the mobile part may get deformed and undergo an undesired spatial displacement, such as might impair proper operation of the structure or, in any case, reduce efficiency thereof.

BRIEF SUMMARY OF THE INVENTION

An embodiment of the present invention provides a manufacturing process allowing a good bonding quality to be achieved between wafers of semiconductor material.

According to the present invention there are provided a process for bonding distinct substrates, as well as a device obtained thereby.

According to an embodiment of the invention, a process for bonding two distinct substrates is provided, comprising the steps of forming micro-integrated devices in at least one of two substrates, using micro-electronic processing techniques and bonding the substrates by forming, on a first of the substrates, bonding structures of deformable material and by pressing the substrates against each other so as to deform the bonding structures and cause the bonding structures to react chemically with a second substrate.

The bonding structures may comprise a stack of layers including a soft layer and a bonding layer. They may also include a diffusion barrier layer between the soft layer and the bonding layer.

The method may also include forming spacing regions on the first substrate, the spacing regions having a thickness less than the thickness of the bonding structures.

Another embodiment of the invention provides an integrated device comprising first and second substrates, distinct from each other, and bonding structures arranged between said first and second substrates, including portions of deformed material and portions of material derived from the reaction between said structures and said second substrate.

The structures may comprise a stack of layers including a soft layer and a bonding layer. A diffusion barrier layer may be formed between the soft layer and the bonding layer.

BRIEF DESCRIPTION OF THE SEVERAL VIEWS OF THE DRAWING(S)

For a better understanding of the present invention, preferred embodiments thereof are now described, purely by way of non-limiting example, with reference to the attached drawings, wherein.

DETAILED DESCRIPTION OF THE INVENTION

The invention is based upon the use of a material having characteristics allowing good-quality bonding of two substrates (namely, two wafers of semiconductor material in which electronic devices and/or micro-electromechanical structures are integrated), even in presence of non-planar areas and/or undesired particles acting as spacers, as generally happens in the case of substrates that have undergone previous fabrication processes.

According to one aspect of the invention, on one of two substrates a layer (possibly a composite layer) is formed having characteristics of high deformability (soft material) and capacity for reaction with the other substrate (bonding material).

In what follows, the term "soft material" or "deformable material" refers to a material which at standard bonding pressures and at a low temperature (of less than 450-500° C., usable in the final fabrication steps) undergoes deformation without causing stresses on the substrates (for example, a material that has a modulus of elasticity of less than one tenth that of silicon).

Figure 2:
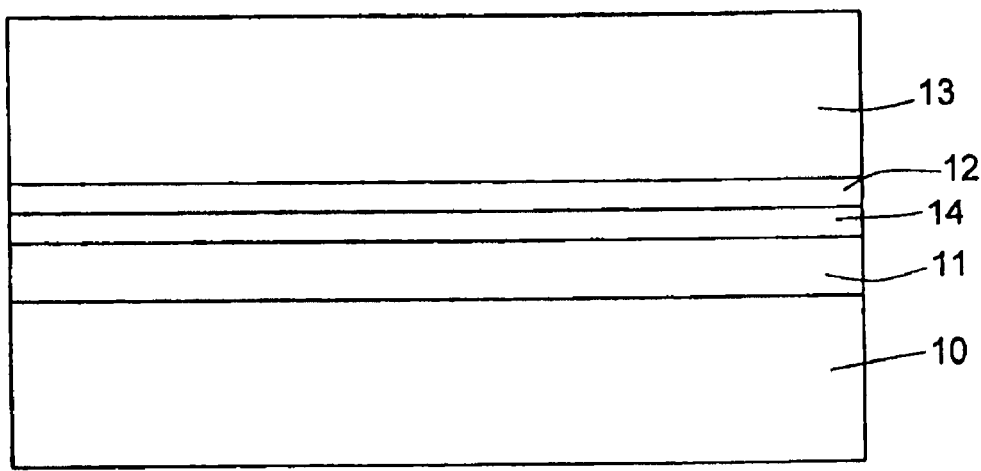
FIG. 2 illustrates a cross-section of two bonded wafers, according to one aspect of the invention.

According to another aspect of the invention, as shown in FIG. 2, on the first substrate (first wafer 10) there is deposited and possibly defined a stack of layers comprising at least one soft layer 11, of a material having good plastic characteristics and low cost (such as aluminum, copper or nickel), and at least one bonding layer 12, which reacts with the material present on the surface of the second substrate (second wafer 13), forming a eutectic or a silicide. A suitable material is, for example, palladium or platinum.

According to yet another aspect of the invention, between the soft layer 11 and the bonding layer 12 a diffusion barrier layer 14 may extend, with the dual function of enabling good adhesion between the soft layer 11 and the bonding layer 12 and of constituting a barrier against the diffusion of the various materials of the soft layer 11 and bonding layer 12. A suitable material is, for instance, chromium or titanium.

Typically, the material of the bonding layer 12 has a high cost, such as to require minimization of its use, adopting low thicknesses.

Figure 1:
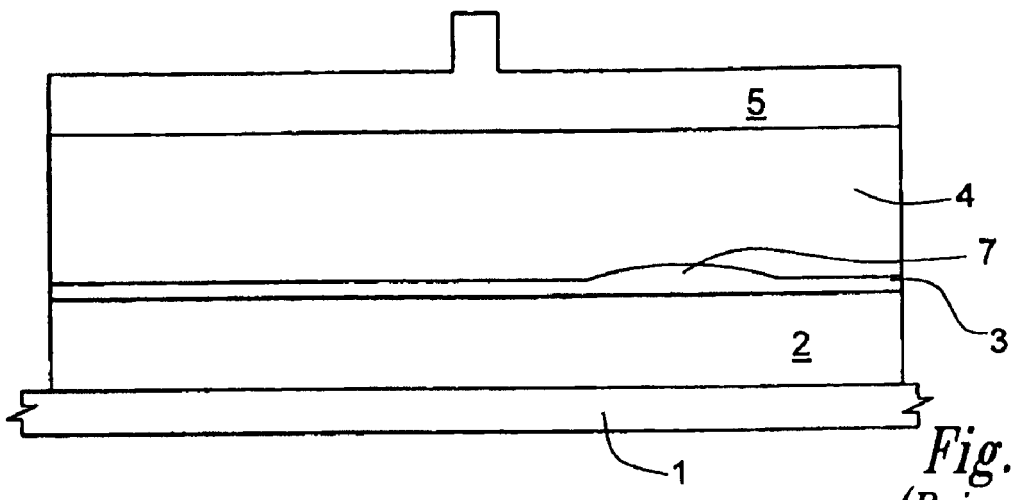
FIG. 1 shows the bonding of two wafers according to the prior art.

In order to carry out bonding, the first wafer 10 and second wafer 13 are brought into mechanical contact with one another. A temperature cycle (for example, at 400° C.) and mechanical pressure (through a piston similar to the piston 5 of FIG. 1) is carried out so as to cause the bonding layer 12 and the second wafer 13 to react and bond. In this step, the soft layer 11 undergoes deformation and adapts to the existing geometry, compensating for any non-planar regions and/or for the presence of foreign bodies. In practice, the soft layer 11, which has a low cost and hence can be deposited with a large thickness, behaves like a cushion and enables a more even distribution of the pressure exerted by the piston, in such a way as to obtain uniform mechanical contact over the entire area to be bonded and in such a way that any foreign bodies are completely surrounded and embedded in said layer.

Hereinafter there will be described an example of a sequence of steps of a process for bonding and electrically connecting two wafers, one of which houses electrical circuits and the other houses a micro-electromechanical device.

Figure 3:
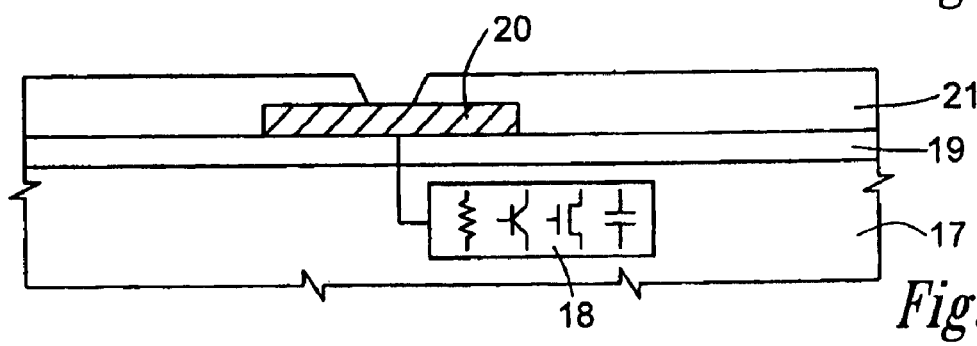
FIGS. 3-10 show, at an enlarged scale, successive steps of the process for bonding two wafers of semiconductor material, according to the invention.

With reference to FIG. 3, first electrical components 18 are formed, in a known way, in a body 17 of semiconductor material. On top of the body 17 various insulating layers—illustrated, for simplicity, as a single insulating layer 19—and various conductive layers, including polycrystalline-silicon regions and various metal levels (not shown in detail) are formed and defined. On top of the insulating layer 19 a top metal layer, for example of aluminum, is formed and defined, thereby forming a contact region 20, connected to the electrical components 18, as schematically shown in FIG. 3. Then a protection layer 21, preferably of silicon dioxide, is deposited and opened, so as to form an opening above the contact region 20.

Figure 4:
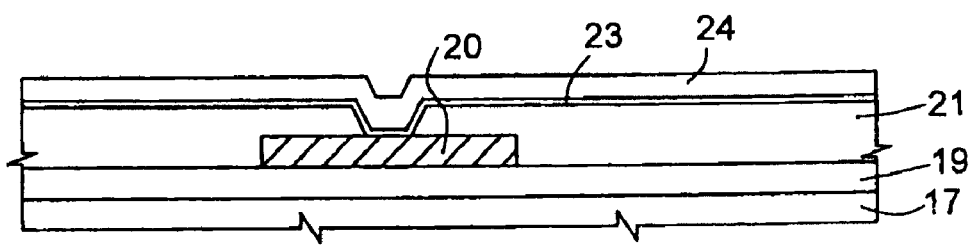
Figure 5:
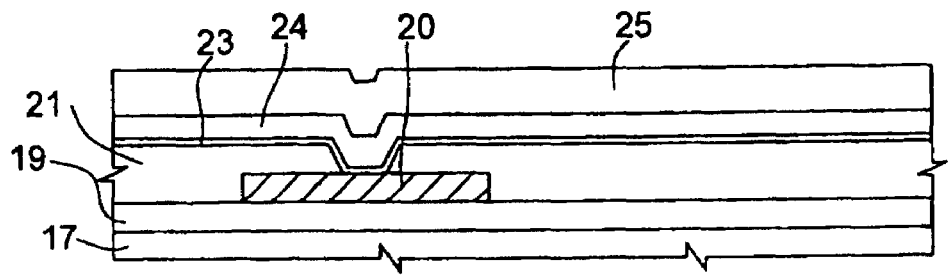

Next (FIG. 4), a first and a second conductive layers 23, 24 are deposited in succession. For example, the first conductive layer 23 may be of tantalum/aluminum, and the second conductive layer 24 may be of aluminum. Then (FIG. 5), a spacing layer 25, for example of silicon dioxide, is deposited.

Figure 6:
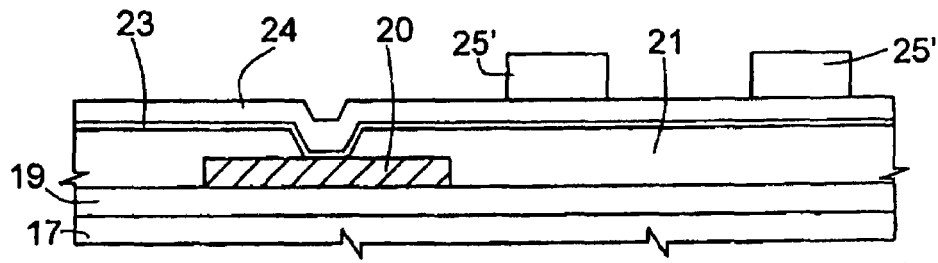
Figure 7:
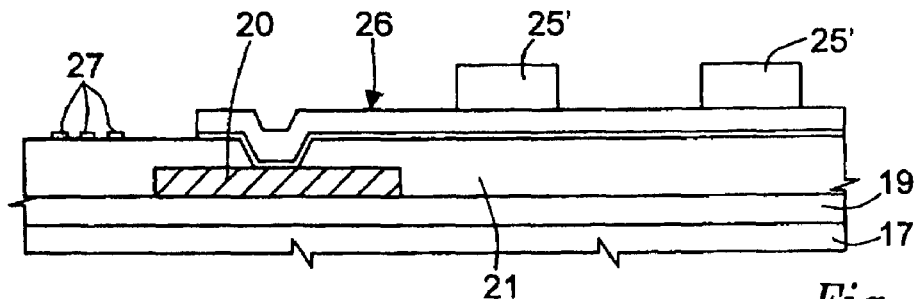

Next (FIG. 6), the spacing layer 25 is defined so as to form spacing regions 25', and (FIG. 7) first the second conductive layer 24 and then the first conductive layer 23 are defined. Thus, connection lines 26 are formed by the overlaid first and second conductive layers 23, 24, and stator electrodes 27 formed by the first conductive layer 23 alone.

Figure 8:
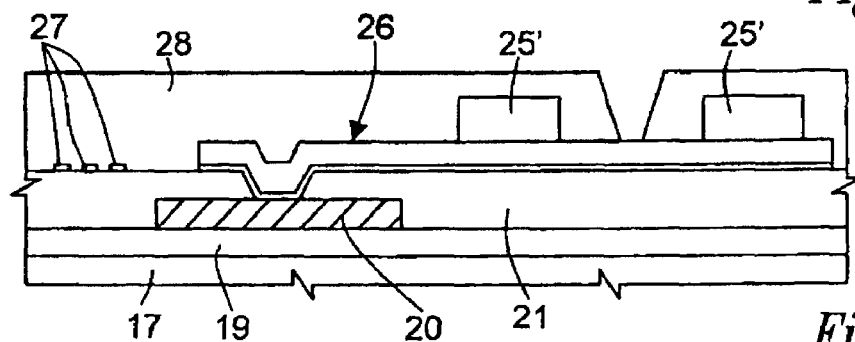
Figure 9:
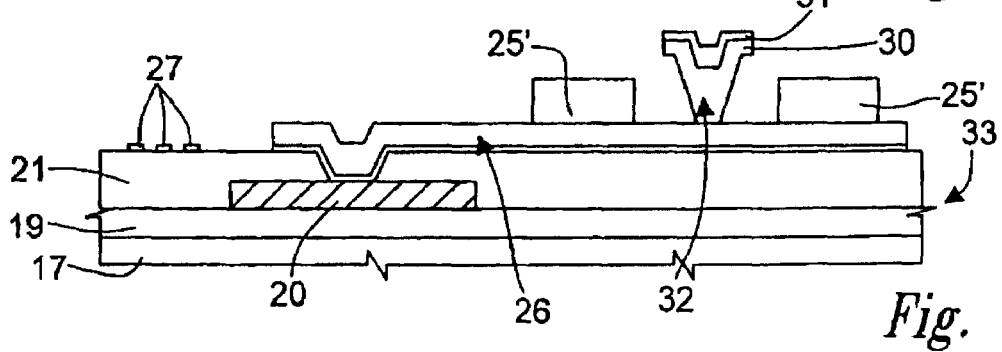
Figure 10:
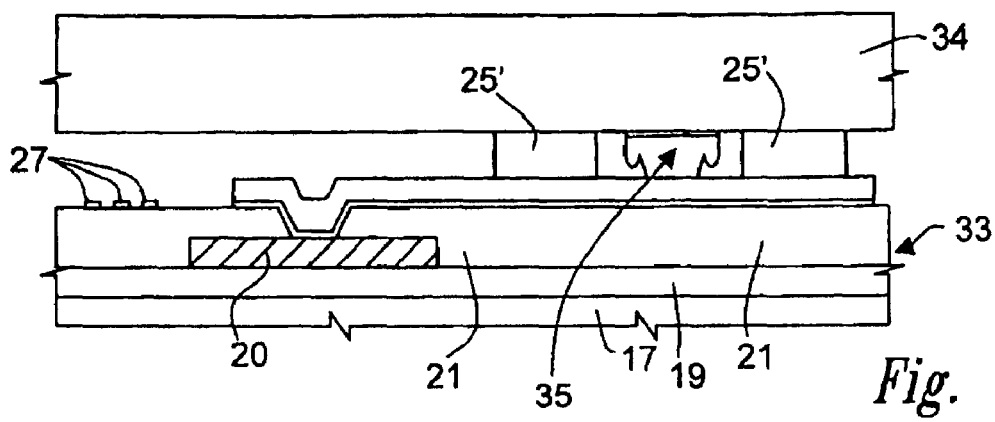

Next (FIG. 8), a sacrificial layer 28, for example of polyimide, is deposited and opened where the bonding regions are to be formed. As shown in FIG. 9, a soft layer 30 (for example of aluminum) and a bonding layer 31 (for example of palladium) are deposited and defined, thus forming bonding regions 32 that extend in part on top of the sacrificial layer 28. In particular, the thickness of the soft layer 30 (which determines, to a first approximation, the thickness of the bonding regions 32) is greater than the thickness of the spacing layer 25. The bonding regions 32 are thus deeper than the spacing regions 25'. Subsequently, the sacrificial layer 28 is removed, and finally (FIG. 10) the wafer 33 thus obtained is bonded to a second wafer 34 in which micromechanical structures (not shown) have been formed.

In this step, the wafers 33, 34 are pressed against one another at a low temperature (for instance, at about 400° C.). Consequently, the aluminum of the soft layer 30, which melts at 600° C., softens and spreads out, thus enabling the second wafer 34 to abut against the spacing regions 25', which thus ensure proper spacing between the wafers 33, 34, while the bonding layer 31 reacts with the second wafer 34 to form a silicide or a eutectic, ensuring bonding of the wafers. Then bonding joints 35 are formed, that buckle with respect to the bonding regions 32. The spacing regions 25' may moreover be shaped in such a way as to surround the bonding joints 35 and isolate them from the outside environment.

Figure 11:
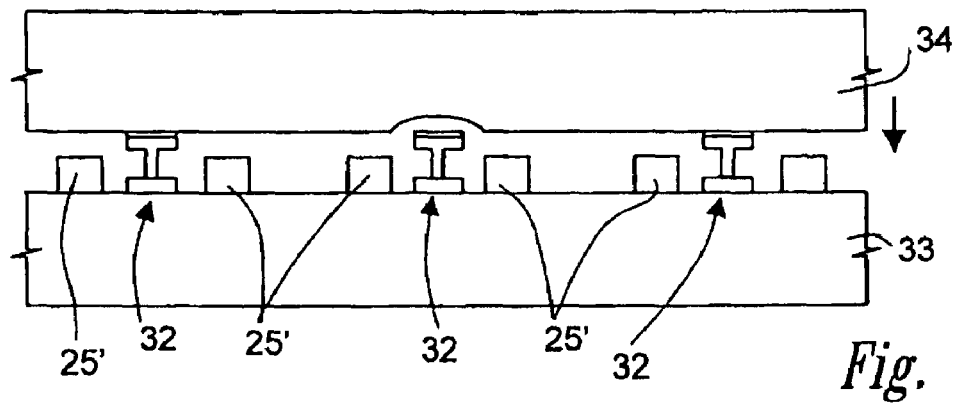
FIGS. 11 and 12 show two steps for bonding two wafers of semiconductor material, in a non-planar surface area.
Figure 12:
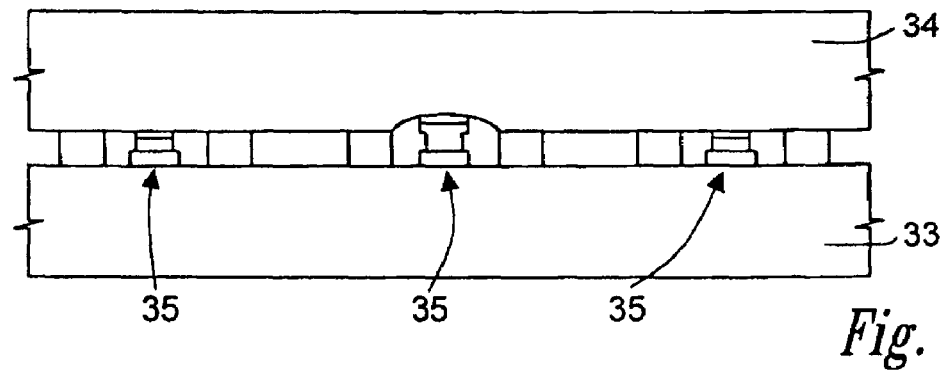

By making the bonding regions 32 of an appropriate depth, equal to at least the sum of the depth of the spacing regions 25' and the possible depressions in the second wafer 34, it is possible to ensure bonding even in the non-planar areas of the wafers 33, 34, as shown in FIGS. 11 and 12, wherein the second wafer 34 has a central depression which would prevent bonding thereof to the first wafer 33. As shown in FIG. 12, the central bonding region 32 is deformed less than the lateral regions, but ensures bonding even so.

Finally, the final fabrication steps are performed, which include, if so envisaged, thinning-out of the first wafer 33 and/or second wafer 34, freeing of the suspended structures, dicing, packaging, etc.

Figure 13:
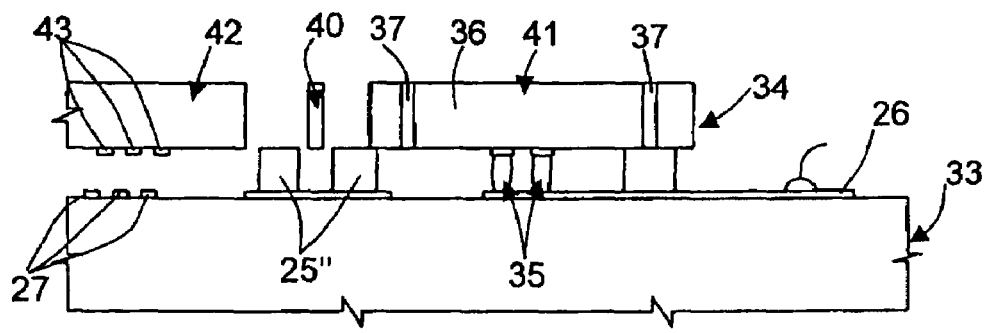
FIG. 13 shows a cross-section of a device formed in two bonded substrates, in a different embodiment of the invention.

In certain applications, it may be necessary to have two or more bonding regions 32 arranged in parallel, so as to obtain a section with adequate contact. In fact, to ensure a sufficient deformability of the bonding regions 32, the portion of soft material cannot have an excessive width, i.e., a width greater than a certain value, which can be determined experimentally. In this case, it is possible to arrange a plurality of bonding joints 35 in parallel. For example, as shown in FIG. 13, two bonding joints 35 are connected to a same connection line 26 on the first wafer 33 and to a same conductive region 36 in the second wafer 34. The conductive region 36 is electrically insulated from the remainder of the second wafer 34 by insulating regions 37.

FIG. 13 also shows two spacing regions 25" which do not surround bonding joints 35 and are formed at regions removed from the second wafer 34. In this case, the spacing regions 25" have a function of mechanical support to the second wafer, wherein a linear electrostatic motor is formed, in order to prevent collapse of the suspended regions. Here, the spacing regions 25" are arranged in the proximity of a "spring" 40 which connects a fixed region 41 of the second wafer 34 (which houses the conductive region 36) to a mobile region ("rotor") 42 provided with mobile electrodes 43. The spacing regions 25" face a removed portion that surrounded the spring 40. Possibly further spacing regions 25" having the function of temporary mechanical suspension may be provided also at the suspended regions and must be removed after the bonding step.

Finally, it is clear that numerous modifications and variations may be made to the process and device described herein, without thereby departing from the scope of the present invention.

In particular, the invention may be applied to integrated devices of any type formed in at least two substrates.

The material of the bonding regions may vary. The diffusion barrier material may be present or not, according to the materials used and to the requirements. The soft layer may be modified in terms of hardness, for example by adding copper to the aluminum. Alternatively, the soft layer may be made entirely of copper, possibly coated with a thin layer of platinum, which forms the bonding layer. The soft material may be nickel protected by a very thin layer of palladium, which is exhausted during bonding and enables the formation of a nickel silicide; in this case, then, the nickel layer works both as a soft material, which undergoes deformation and enables adaptation of the bonding joints to the existing geometry, and as a bonding material, which ensures mechanical connection between the two wafers.

Obviously, the same process can be used to bond three or more wafers together.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A process for bonding two distinct substrates integrating electronic and/or micro-electromechanical devices, comprising the steps of:
   forming micro-integrated devices in at least one of two substrates, using micro-electronic processing techniques; and
   bonding said substrates by:
      forming, on a first of said substrates, a bonding structure including a stack of layers, the stack of layers including a soft layer of deformable material and a bonding layer;
      placing the bonding layer in contact with a second of said substrates; and
      pressing said first and second substrates against each other so as to deform said soft layer and cause said bonding layer to react chemically with the second substrate.

2. The process according to claim 1, further comprising forming a diffusion baffler layer between said soft layer and said bonding layer.

3. The process according to claim 1 wherein said soft layer is of a material chosen from among aluminum, aluminum and copper alloy, copper, and nickel, and said bonding layer is of a material chosen from between palladium and platinum.

4. The process according to claim 2, wherein said diffusion barrier layer is of a material chosen from between chromium and titanium.

5. The process according to claim 1, further comprising forming spacing regions having a first depth, said bonding structure comprising bonding regions having a second depth greater than said first depth, wherein said pressing step comprises bringing said second substrate in abutment against said spacing regions.

6. The process according to claim 5, wherein said step of forming bonding structures comprises:
   depositing and defining a spacing layer on top of said first substrate to form said spacing regions;
   depositing a sacrificial layer on top of said first substrate and said spacing regions;
   selectively removing said sacrificial layer in areas to be bonded;
   forming a stack of layers including a soft layer and a bonding layer;
   defining said stack of layers to form said bonding regions in said areas to be bonded; and
   removing said sacrificial layer.

7. The process according to claim 1, further comprising heating the first and second substrates, during the pressing step, to a temperature lower than a melting temperature of the soft layer.

8. A method, comprising:
   forming a first layer on a first surface of a first semiconductor material substrate, of a material deformable under a selected pressure and temperature less than a pressure and temperature required to deform the substrate;
   forming a second layer over the first layer, of a material capable of bonding with a semiconductor material substrate under the selected temperature and pressure without melting;
   defining, in the first and second layers, a plurality of bonding structures;
   positioning a second semiconductor material substrate above the first surface of the first substrate; and
   bonding the second substrate to the first substrate by biasing the first and second substrates together with the selected pressure and temperature, causing, thereby, the bonding structures to deform and bond with the material of the second substrate.

9. The method of claim 8, further comprising forming a diffusion barrier layer between the first layer and the second layer.

10. The method of claim 8, further comprising forming, on the first surface of the first semiconductor material substrate, a spacing structure having a thickness less than the thickness of the bonding structures.

11. The method of claim 10 wherein the step of forming a spacing structure comprises forming a plurality of spacing structures on the first surface of the first semiconductor material layer.

12. The method of claim 10 wherein:
   the step of forming a first layer comprises depositing a layer of material chosen from among aluminum, aluminum and copper alloy, copper, and nickel; and
   the step of forming a second layer comprises depositing a layer of material chosen from among palladium and platinum.

13. A method of manufacturing an integrated device comprising:
   placing first and second semiconductor material substrates in face-to-face contact with each other; and applying pressure and heat to the first and second substrates, thereby deforming a soft layer of a bonding structure positioned on a face of the first substrate and chemically reacting a bonding layer of the bonding structure with the second substrate, bonding the first and second substrates together without melting the soft layer or the bonding layer.

14. The method of claim 13, wherein the bonding step comprises forming a silicide of the material of the second substrate and material of the bonding layer.

15. The method of claim 13, wherein the bonding step comprises forming a eutectic of the material of the second substrate and material of the bonding layer.

16. The method of claim 13, further comprising preventing diffusion between the soft layer and the bonding layer of the bonding structure.

17. The method of claim 13, wherein the applying pressure and heat step comprises applying pressure and heat until one of the first and second substrates contacts a spacing region positioned on a surface of the other of the first and second substrates.

18. The process according to claim 1 wherein the pressing comprises pressing said first and second substrates against each other so as to cause said bonding layer to form a silicide with material of the second substrate.

19. The process according to claim 1 wherein the pressing comprises pressing said first and second substrates against each other so as to cause said bonding layer to form a eutectic with material of the second substrate.

20. The method of claim 10 further comprising:
biasing the first and second substrates together causing the spacing structure to contact the first surface of the second substrate.

21. The method of claim 8 wherein the bonding comprises biasing the first and second substrates together, causing the bonding structures to form respective silicides with a first surface of the second substrate.

22. A process for bonding first and second semiconductor material substrates, comprising:
forming micro-integrated devices in one of the first and second substrates, using micro-electronic processing techniques; and
bonding the first and second substrates by:
forming, on the first substrate, bonding structures of deformable material and bonding material; and by
pressing the first substrate and the second substrate against each other so as to deform the bonding structures and cause the bonding structures to form a silicide with the second substrate.

23. The process of claim 21, comprising:
forming and defining, on the surface of the first substrate, a spacing layer having a thickness less than a thickness of the bonding structures;
and wherein:
the forming bonding structures comprises forming and defining, on the first substrate, a deformable layer of the deformable material and a bonding layer of the bonding material;
the pressing comprises pressing the first and second substrates against each other at a pressure and a temperature sufficient to deform the deformable layer without melting the deformable layer or the bonding layer, until the spacing layer contacts a surface of the second substrate.

24. The process of claim 23, comprising forming a diffusion barrier layer between the deformable layer and the bonding layer.

* * * * *